(12) United States Patent
Kamiyama et al.

(10) Patent No.: US 9,099,597 B2
(45) Date of Patent: Aug. 4, 2015

(54) LIGHT EMITTING DIODE ELEMENT WITH POROUS SiC EMITTING BY DONOR ACCEPTOR PAIR

(75) Inventors: Satoshi Kamiyama, Aichi (JP); Motoaki Iwaya, Aichi (JP); Hiroshi Amano, Aichi (JP); Isamu Akasaki, Aichi (JP); Takuya Nishimura, Aichi (JP); Fumiharu Teramae, Aichi (JP); Toshiyuki Kondo, Aichi (JP)

(73) Assignee: MEIJO UNIVERSITY, Nagoya-Shi, Aichi (JP)

( * ) Notice: Subject to any disclaimer, the term of this patent is extended or adjusted under 35 U.S.C. 154(b) by 186 days.

(21) Appl. No.: 13/259,705

(22) PCT Filed: Mar. 26, 2010

(86) PCT No.: PCT/JP2010/055383
§ 371 (c)(1),
(2), (4) Date: Oct. 31, 2011

(87) PCT Pub. No.: WO2010/110427
PCT Pub. Date: Sep. 30, 2010

(65) Prior Publication Data
US 2012/0037923 A1 Feb. 16, 2012

(30) Foreign Application Priority Data
Mar. 27, 2009 (JP) ................. 2009-080543

(51) Int. Cl.
*H01L 33/00* (2010.01)
*H01L 33/08* (2010.01)
(Continued)

(52) U.S. Cl.
CPC .............. *H01L 33/08* (2013.01); *H01L 33/16* (2013.01); *H01L 33/007* (2013.01); *H01L 33/12* (2013.01); *H01L 33/343* (2013.01)

(58) Field of Classification Search
CPC ....... H01L 33/007; H01L 33/08; H01L 33/16; H01L 33/18; H01L 33/26; H01L 33/34; H01L 21/0203; H01L 21/02109; H01L 21/02112; H01L 21/02203
USPC .................. 257/94, 96, 97, 98, 101, 102, 103
See application file for complete search history.

(56) References Cited

U.S. PATENT DOCUMENTS 5,027,168 A * 6/1991 Edmond ........................ 257/103
5,272,355 A * 12/1993 Namavar et al. ................. 257/3
(Continued)

FOREIGN PATENT DOCUMENTS

JP      06-275866 A     9/1994
JP      2005-187791 A     7/2005
(Continued)

OTHER PUBLICATIONS

Sagar et al., "Plasma-assisted molecular beam epitaxy of GaN on porous SiC substrates with varying porosity", Journal of Vacuum Science and Technology B 21 (2003) pp. 1812-1817.*
(Continued)

*Primary Examiner* — Jay C Kim
(74) *Attorney, Agent, or Firm* — Roberts Mlotkowski Safran & Cole P.C.

(57) ABSTRACT

A light emitting diode is provided which can obtain emission at the shorter wavelength side of the emission range of normal 6H-type SiC doped with B and N. A porous layer 124 consisting of single crystal 6H-type SiC of porous state is formed on a SiC substrate 102 of a light emitting diode element 100. Visible light is created from blue color to green color when the porous layer 124 is excited by ultra violet light emitted from the nitride semiconductor layer.

9 Claims, 11 Drawing Sheets (51) Int. Cl.
  *H01L 33/16* (2010.01)
  *H01L 33/12* (2010.01)
  *H01L 33/34* (2010.01)

(56) References Cited

U.S. PATENT DOCUMENTS

| | | | | |
|---|---|---|---|---|
| 5,285,078 | A | * | 2/1994 | Mimura et al. ............... 257/3 |
| 5,331,180 | A | * | 7/1994 | Yamada et al. ............... 257/3 |
| 5,427,977 | A | | 6/1995 | Yamada et al. |
| 5,569,932 | A | * | 10/1996 | Shor et al. ............... 257/3 |
| 5,739,554 | A | * | 4/1998 | Edmond et al. ............ 257/103 |
| 6,210,987 | B1 | * | 4/2001 | Kurtz et al. ............... 438/47 |
| 6,225,647 | B1 | * | 5/2001 | Kurtz et al. ............... 257/94 |
| 6,972,438 | B2 | * | 12/2005 | Li et al. ............... 257/98 |
| 7,276,117 | B2 | * | 10/2007 | Basceri et al. ............. 117/88 |
| 7,521,727 | B2 | * | 4/2009 | Khanarian et al. .......... 257/98 |
| 2007/0176531 | A1 | | 8/2007 | Kinoshita et al. |

FOREIGN PATENT DOCUMENTS

| | | |
|---|---|---|
| JP | 2006-303154 A | 11/2006 |
| JP | 2007-214469 A | 8/2007 |
| JP | 2007-320790 A | 12/2007 |
| JP | 2008-270669 A | 11/2008 |
| JP | 2009-033203 A | 2/2009 |

OTHER PUBLICATIONS

Kamiyama et al., "Extremely high quantum efficiency of donor-acceptor-pair emission in N-and-B-doped 6H-SiC", Journal of Applied Physics 99 (2006) 093108.*

Notification of Transmittal of Translation of the International Preliminary Report on Patentability issued in corresponding application PCT/JP2010/055383, mailed Nov. 24, 2011.

* cited by examiner

LIGHT EMITTING DIODE ELEMENT WITH POROUS SIC EMITTING BY DONOR ACCEPTOR PAIR

TECHNICAL FIELD

The present invention relates to a light emitting diode element and a method for manufacturing the same.

BACKGROUND ART

An LED (light emitting diode) is widely put to practical use and mainly used in applications for optical transmission, display and special illumination as an element having a p-n junction of compound semiconductor. In recent years, a white light LED using nitride semiconductors and phosphors is also put to practical use and it is highly expected to expand into an application for generic illumination in the future. However, in case of the white LED, because energy conversion efficiency is inadequate compared to an existing fluorescent bulb, a major efficiency improvement is necessary for a generic illumination application. Furthermore, there are still many problems for an achievement of an LED having a low cost and high luminous flux. As a white light LED on the market now, it comprising a blue light emitting diode element mounted on a lead frame, a yellow phosphor layer which consists of YAG:Ce and is covered on this blue light emitting diode element, and a mold lens which consists of a transparent resin of an epoxy resin etc. and covers them is known. In case of this white LED, when blue light is emitted from the blue emitting diode element, a part of the blue light is converted to yellow light in passing through the yellow phosphor. Because blue light and yellow light have a relationship of complimentary colors each other, white light is made by mixing blue light and yellow light. In case of this white LED, a performance upgrade etc. of the blue light emitting diode element is required for an efficiency improvement and an advancement of color rendering properties.

As the blue light emitting diode element, it has a n-type SiC substrate on which a buffer layer consisting of AlGaN, a n-type GaN layer consisting of n-GaN, a multiple quantum well active layer consisting of p-AlGaN and a p-type contact layer consisting of p-GaN are continuously stacked in this order is known. Also, a p-side electrode is formed on a surface of the p-type contact layer and an n-side electrode is formed on a backside of the SiC substrate, and blue light is emitted from the multiple quantum well active layer when passing an electric current by applying a voltage between the p-side electrode and the n-side electrode. In this the blue light emitting diode element, unlike in case of a blue emitting diode element using a sapphire substrate, because the SiC substrate has a conductive property and the electrodes can be arranged on the upper side and the under side, a reduction of manufacturing processes, an in-plane uniformity property of the electric current, an efficient use of an emission area in a chip area etc. are achieved.

Furthermore, an emitting diode element which produces white light by itself is proposed (for example, see the patent literature 1). In this emitting diode element, a fluorescent SiC substrate having a first SiC layer doped B and N and a second SiC layer doped Al and N is used instead of the n-type SiC substrate of the blue emitting diode element described above, and near-ultraviolet light is emitted from the multiple quantum well active layer. The near-ultraviolet light is absorbed by the first SiC layer and the second SiC layer, and coverted to visible light which is from green light to red light in the first SiC layer and visible light which is from blue light to red light in the second SiC layer respectively. As a result, white light which is a high color rendering property and close to sun light is emitted from the fluorescent SiC substrate.

CITATION LIST

Patent Literature

PATENT LITERATURE 1: Japanese Patent Publication No. 4153455

SUMMARY OF THE INVENTION

Technical Problem

However, in the light emitting diode element described in the patent literature 1, when B interfuses with the second SiC layer, at least a part of emission between impurity levels in Al and N disappears and emission between impurity levels in B and N appears, thus a desired emission property may not be obtained. If a fluorescent SiC substrate which is doped with B in high concentration is used, it is difficult to prevent B from interfusing with the second SiC layer perfectly because B once resolved is taken in the second SiC layer during growing the SiC layers or B interfuses with the second SiC layer by solid-phase diffusion.

The present invention has been achieved in view of the above-mentioned background, thus, an object of the present invention is to provide a light emitting diode which can obtain emission at shorter wavelength side of emission range of normal 6H-type SiC doped with B and N, and a method for manufacturing the same.

Technical Solution

In order to achieve the above purpose, a light emitting diode element comprising; a semiconductor emitting part; and a porous SiC part which consists of porous state of single crystal 6H-type SiC doped with N and B, and emits visible light when excited by light from the semiconductor emitting part is provided by this invention.

In the above light emitting diode element, it may further comprise a protection film covering a surface of the porous SiC part.

In the above light emitting diode element, it may further comprise a bulk SiC part which consists of bulk state of single crystal 6H-type SiC doped with N and B, and emits visible light at longer wavelength than the porous SiC part when excited by light from the semiconductor emitting part.

In the above light emitting diode element, the porous SiC part may be made by changing a part of the bulk SiC part to porous state.

In the above light emitting diode element, the semiconductor emitting part may be formed on the bulk SiC part which is partially changed to porous state.

Also, a method for manufacturing a light emitting diode element comprising the steps of forming an ohmic electrode on bulk state of single crystal 6H-type SiC doped with N and B; and forming the porous SiC part by carrying out anodic oxidation to the bulk state of single crystal 6H-type SiC formed the ohmic electrode is provided by this invention.

In the above method for manufacturing a light emitting diode element, it may comprise the further steps of forming a protection film on the porous SiC part which is heat treated.

In the above method for manufacturing a light emitting diode element, hydrofluoric acid aqueous solution added an oxidation agent may be used as solution reacting with the single crystal 6H-type SiC during the anodic oxidation.

In the above method for manufacturing a light emitting diode element, the oxidation booster may be potassium persulfate.

Effect of the Invention

According to the present invention, emission at shorter wavelength side of emission range of normal 6H-type SiC doped with B and N can be obtained.

BEST MODE FOR CARRYING OUT INVENTION

Figure 1:
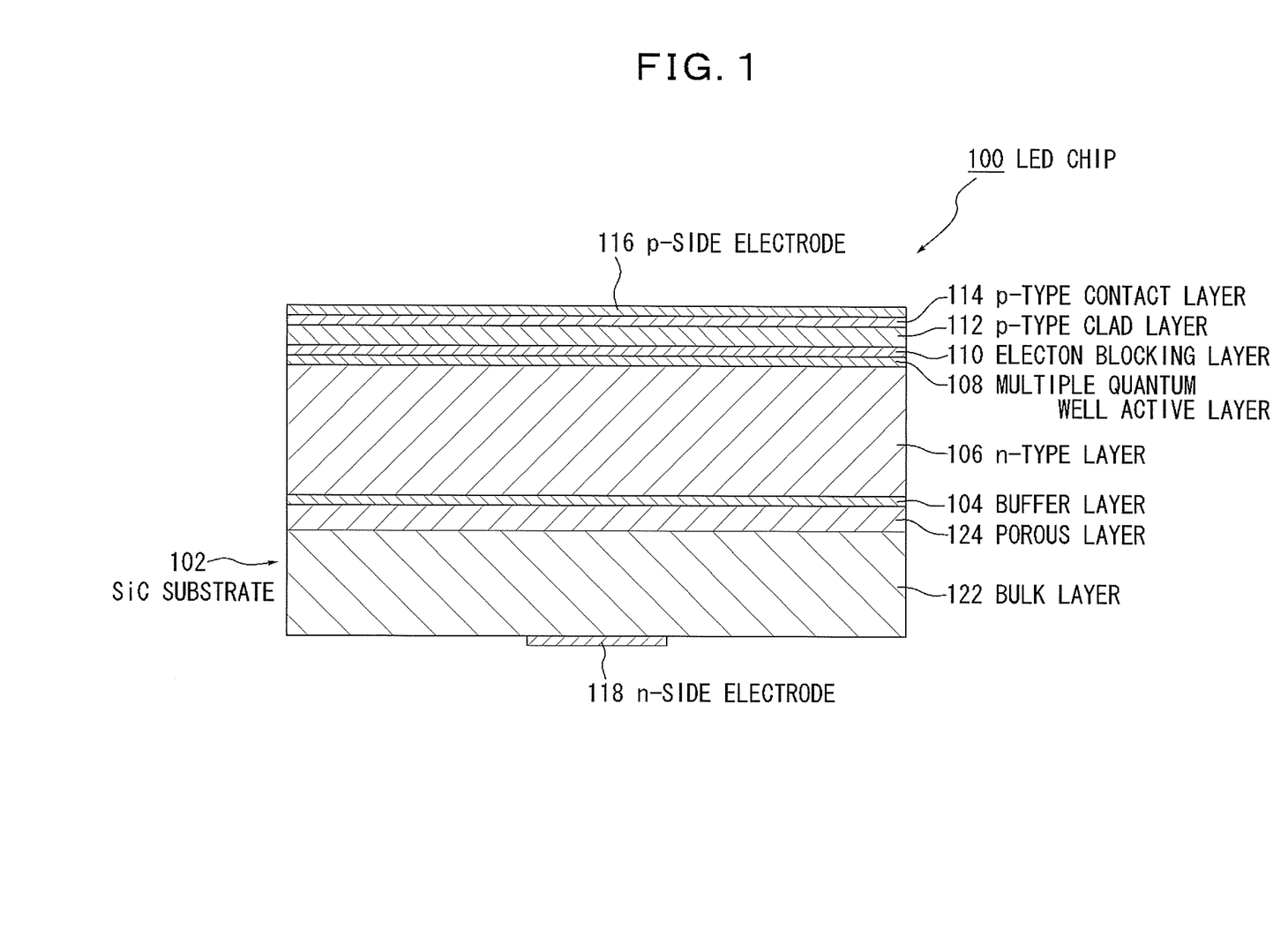
FIG. 1 is a typical cross-sectional drawing of a light emitting diode element of an embodiment of this invention.

FIG. 1, FIG. 2, FIG. 3, FIG. 4 and FIG. 5 show an embodiment of this invention and FIG. 1 is a typical cross-sectional drawing of a light emitting diode element.

As shown in FIG. 1, a light emitting diode element 100 comprises SiC substrate 102, a nitride semiconductor layer formed on the SiC substrate 102. The nitride semiconductor layer as a semiconductor emitting part has a coefficient of thermal expansion of $5.6 \times 10^{-6}/°$ C. and has a buffer layer 104, an n-type layer 106, a multiple quantum well active layer 108, an electron blocking layer 110, a p-type clad layer 112 and a p-type contact layer 114 in this order from the SiC substrate 102 side. A p-side electrode 116 is formed on the p-type contact layer 114 and an n-side electrode 118 is formed on a backside of the SiC substrate 102.

The SiC substrate 102 consists of single-crystal 6H-type SiC and has a coefficient of thermal expansion of $4.2 \times 10^{-6}/°$ C. The SiC substrate 102 has a bulk layer 122 consisting of bulk state of single-crystal 6H-type SiC doped with N and B and a porous layer 124 consisting of porous state of single-crystal 6H-type SiC doped with N and B. The term "bulk state" means that it does not have an interface between itself and other materials in its interior, or if it has the interface, it has state with a change of physical value can be neglected. Also, the term "porous state" means that it is formed in cellular state and has an interface between itself and atmosphere in its interior.

The bulk layer 122 as a bulk SiC part emits visible light of roughly from yellow color to orange color by donor-acceptor-pair emission when excited by ultra violet light. The bulk layer 122 emits light of wavelength of 500 nm-750 nm and it has a peak within 500 nm-650 nm. In this embodiment, the bulk layer 122 is tuned such that it emits light of peak wavelength of 580 nm. Doping concentration of B and N in the bulk layer 122 is $10^{15}/cm^3$-$10^{19}/cm^3$. The bulk layer 122 can be excited by light of 408 nm or less than 408 nm.

The porous layer 124 as a porous SiC part emits visible light of roughly from blue color to green color by donor-acceptor-pair emission when excited by ultra violet light. The porous layer 124 emits light of wavelength of 380 nm-700 nm and it has a peak within 400 nm-500 nm. In this embodiment, the porous layer 124 is tuned such that it emits light of peak wavelength of 450 nm. Doping concentration of B and N in the porous layer 124 is $10^{15}/cm^3$-$10^{19}/cm^3$. A surface of the porous layer 124 is covered by a protection film such that it is not directly exposed to atmosphere. In this embodiment, the protection film consists of nitride.

The buffer layer 104 is formed on the SiC substrate 102 and consists of AlGaN. In this embodiment, the buffer layer 104 is grown at lower temperature than the n-type layer 106 etc. described below. The n-type layer 106 is formed on the buffer layer 104 and consists of n-GaN.

The multiple quantum well active layer 108 is formed on the n-type layer 106 and consists of GaInN/GaN and emits, for example, excitation light by an injection of electrons and holes. In this embodiment, the multiple quantum well active layer 108 consists of $Ga_{0.95}In_{0.05}N/GaN$ and emits at peak wavelength of 385 nm. The peak wavelength of the multiple quantum well active layer 108 can be arbitrarily changed.

The electron blocking layer 110 is formed on the multiple quantum well active layer 108 and consists of p-AlGaN. The p-type clad layer 112 is formed on the electron blocking layer 110 and consists of p-AlGaN. The p-type contact layer 114 is formed on the p-type clad layer 112 and consists of p-GaN.

It is formed by epitaxial growth of group-III nitride semiconductor from the buffer layer 104 to the p-type contact layer 114. The nitride semiconductor layer constitution is arbitrary if it contains at least a first conductivity layer, an active layer and a second conductivity layer and the active layer emits by recombination of electrons and holes when applying a voltage between the first conductivity layer and the second conductivity layer.

The p-side electrode 116 is formed on the p-type contact layer 114 and consists of, for example, Ni/Au, and formed by a vacuum evaporation method, sputtering method, CVD (Chemical Vapor Deposition) method etc. The n-side electrode 118 is formed on the SiC substrate 102 and consists of, for example, Ti/Al/Ti/Au, and formed by a vacuum evaporation method, sputtering method, CVD (Chemical Vapor Deposition) method etc.

Figure 2:
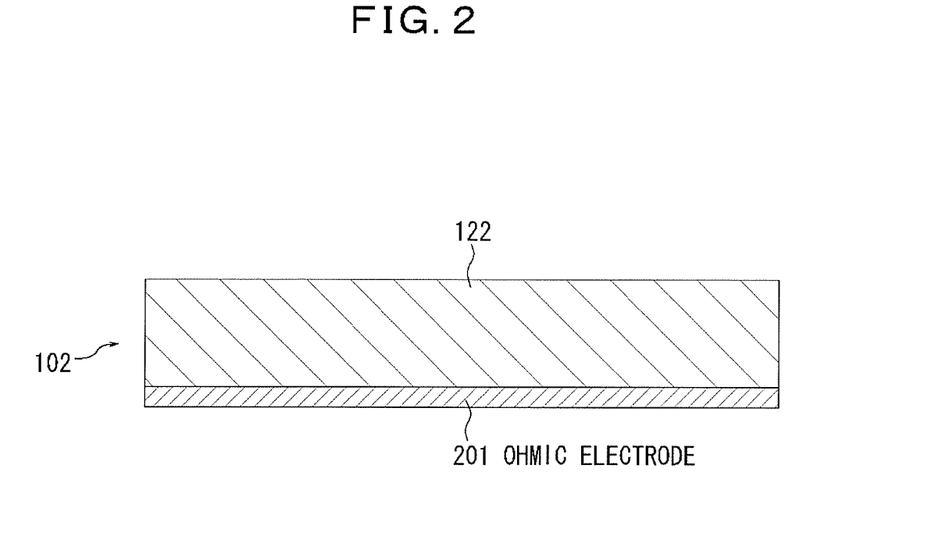
FIG. 2 is a typical cross-sectional drawing of a SiC substrate formed an ohmic electrode.

A method for manufacturing the light emitting diode element 100 is explained in reference to FIG. 2, FIG. 3, FIG. 4, FIG. 5 and FIG. 6. FIG. 2 is a typical cross-sectional drawing of a SiC substrate formed an ohmic electrode.

First, bulk state of single-crystal 6H-type SiC doped with N and B is produced by a sublimation method and the SiC substrate 102 consisting of the bulk layer 122 is made (Preparing bulk SiC step). Doping concentration of B and N in the SiC crystal can be controlled by adding impurity gas to atmosphere gas during crystal growth and adding impurity elements or its compounds to raw powder. The thickness of the SiC substrate 102 is arbitrary and, for example, it is 250 µm. This SiC substrate 102 is made through the steps of peripheral grinding, slicing, surface grinding, surface polishing etc. after bulk crystal of about 30 mm is made by bulk growth of the sublimation method.

As shown in FIG. 2, an ohmic electrode 201 is formed on one side of the SiC substrate 102 (Forming electrode step). In this embodiment, the ohmic electrode 201 consists of Ni and is heat treated after deposited by a sputtering method. The thickness of the ohmic electrode 201 is arbitrary and, for example, it is 100 µm and heat treated at about 1000° C. In case of forming the porous layer 124 on a (0001) Si-plane side of the SiC substrate 102, the ohmic electrode 201 is formed on a C-plane. In case of forming the porous layer 124 on the C-plane side, the ohmic electrode 201 is formed on the Si-plane.

Figure 3:
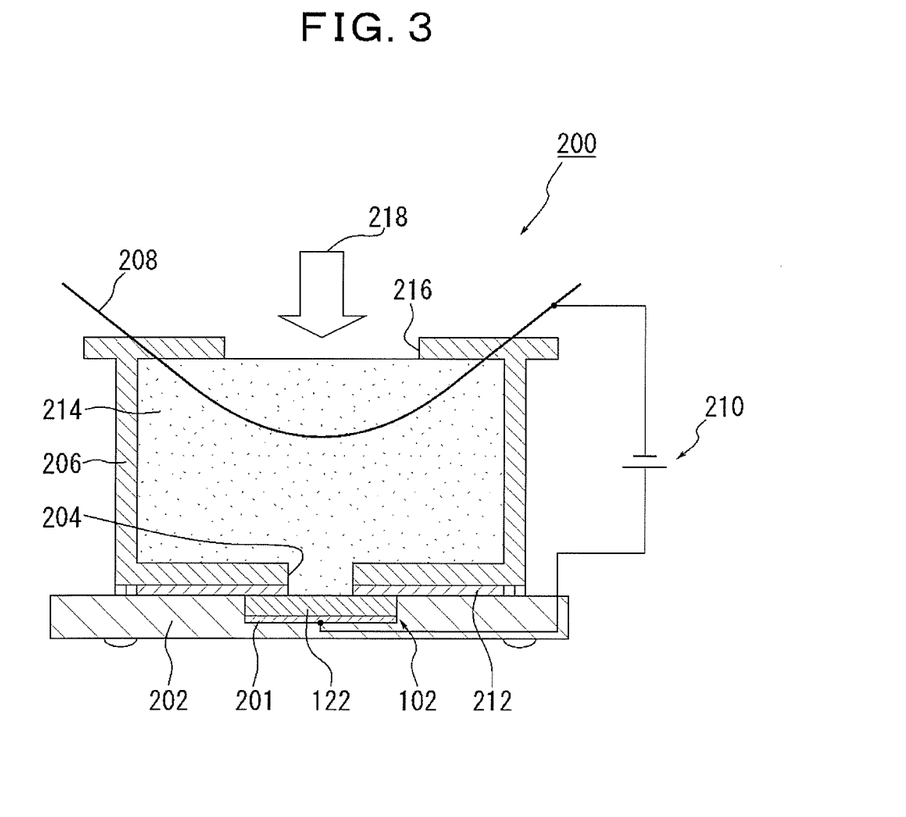
FIG. 3 is an explanation drawing of an anodic oxidation apparatus changing a SiC substrate to porous state.

FIG. 3 is an explanation drawing of an anodic oxidation apparatus changing a SiC substrate to porous state.

As shown in FIG. 3, an anodic oxidation apparatus 200 comprises a stainless plate 202 on which the SiC substrate 102 put, a teflon (registered trademark) vessel 206 which is placed above the stainless plate 202 and has an aperture 204 formed immediately above the SiC substrate 102, a platinum wire 208 placed in the vessel 206, and a DC power source 210 applying a voltage between the SiC substrate 102 and the platinum wire 208. The vessel 206 is provided on the stainless plate 202 on contact with an anti-hydrofluoric-acid sheet 212 and its inside is filled with solution 214. The vessel 206 has an aperture 216 which is formed at the upper part such that ultra violet light 218 can be incident light into its inside.

In this embodiment, the solution 214 is hydrofluoric acid aqueous solution made by diluting hydrofluoric acid with pure water and is arbitrarily added potassium persulfate as an oxidation agent. Doping concentration of hydrofluoric acid is arbitrary and, for example, its mass concentration can be 3%-10%. Instead of water, ethanol can be used as solvent of hydrofluoric acid. It is arbitrary whether adding potassium persulfate or not, the concentration in case of adding is also arbitrary, for example, it can be less than 0.1 mol/l. Potassium persulfate can accelerate forming the porous layer 124 by the anodic oxidation because it has a function to accelerate a chemical oxidation reaction of SiC crystal. Instead of potassium persulfate, sulphuric acid, nitric acid etc. can be used as an oxidation agent.

In this anodic oxidation apparatus 200, an electric current is passed between the SiC substrate 102 and the platinum wire 208 by applying a plus voltage to the ohmic electrode 201 by the DC power source 210 with contacting the bulk layer 122 of the SiC substrate 102 to the solution 214. After the current start to be passed, a following chemical reaction is driven against the inside from the surface of SiC substrate 102.

[Mathematical formula 1]

$$SiC + 6OH^- \rightarrow SiO_2 + CO_2 + 2H_2O + 2H^+ + 8e^- \quad (1)$$

$$SiO_2 + 6F^- + 2H^+ \rightarrow H_2SiF_6 + 2H_2O + 4e^- \quad (2)$$

SiC changes to $SiO_2$ and $CO_2$ by the oxidation reaction and $SiO_2$ also changes to soluble $H_2SiF_6$ by fluorine ions and it is soluble in solution. $CO_2$ disappears by vaporization because it is gas. This reaction is driven in a relatively weak direction of SiC atomic binding and hollows are formed in a direction tilted at predefined angle to the surface of the SiC substrate 102.

Figure 4:
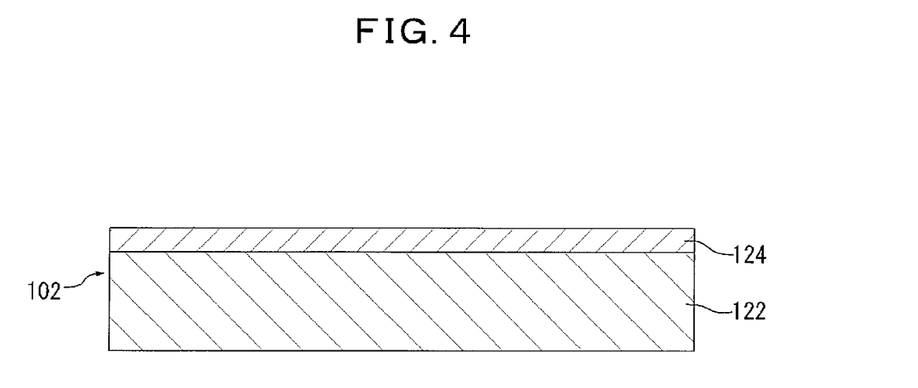
FIG. 4 is a typical cross-sectional drawing of a SiC substrate formed a porous layer.
Figure 5:
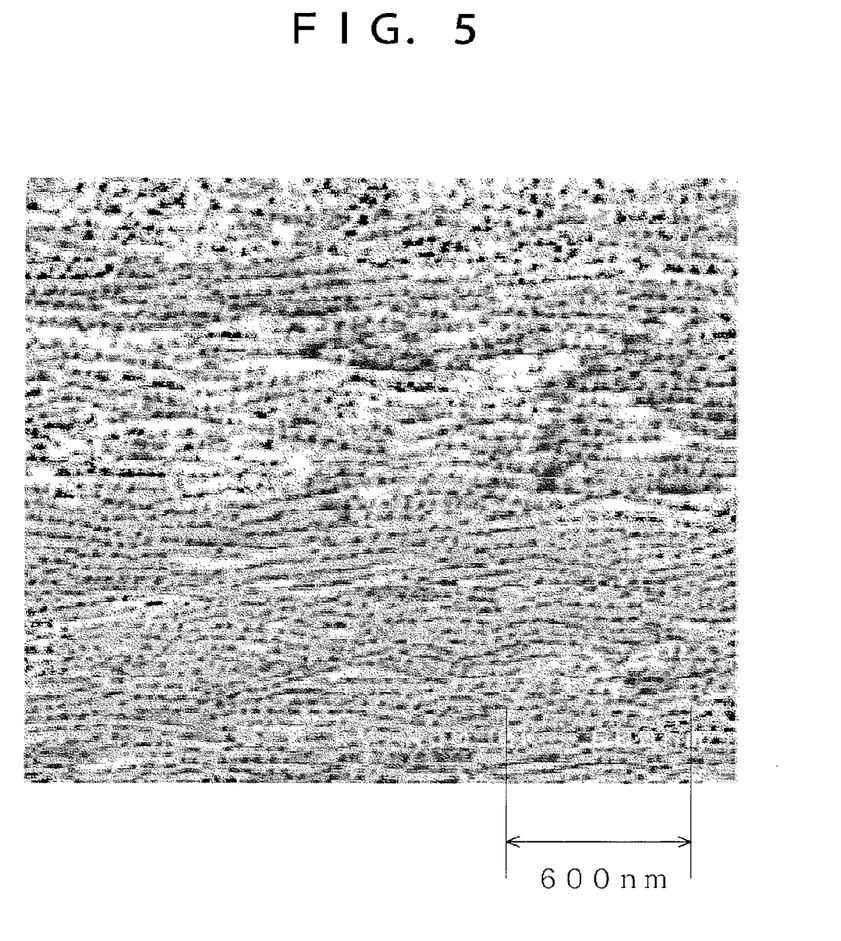
FIG. 5 is a electronic microscope photograph of cross-section of a porous layer which was made.

FIG. 4 is a typical cross-sectional drawing of a SiC substrate formed a porous layer and FIG. 5 is a electronic microscope photograph of cross-section of a porous layer which was made.

As shown in FIG. 4, the porous layer 124 is formed from the surface of bulk layer 122 by the anodic oxidation. FIG. 4 shows the SiC substrate 102 which is removed the ohmic electrode 201 after forming the porous layer 124. As shown in FIG. 5, it is understood that hollows which has comparatively regularity across the cross-section surface in the porous layer 124 which is actually obtained. In case that the reaction is driven at (0001) Si side surface of the SiC substrate 102, the hollows are formed in a direction tilted at 54 agree to the surface.

Current density of the SiC substrate 102 is arbitrary, however, if current value is too high, the hollows of the porous layer 124 is close to a vertical direction to the surface of the SiC substrate 102 and their shape is also inhomogeneous, thus, it is preferable that the current value is lower. Specifically, it is preferable that the current density is less than 10 $mA/cm^2$ and it is typically 2 $mA/cm^2$. The thickness of the porous layer 124 is proportional to time for the anodic oxidation and it is 50 nm in this embodiment.

The reaction of the above formula (I) is accelerated and the number of the hollows of the porous layer 124 is increased by adding potassium persulfate. Thus, average size of residual crystal forming the porous layer 124 is shrunk.

In this embodiment, the SiC substrate 102 is heat treated after forming the porous layer 124 (Heat treat step). Specifically, excess extracted C on the crystal surface of the porous layer 124 is removed by the heat treat at 1000° C.~1400° C. in hydrogen atmosphere.

In this embodiment, the protection film is formed after the porous layer 124 is heat treated (Forming protection film step). Specifically, the protection film of $Si_3N_4$ is formed on the clean crystal surface and the surface level of the porous layer 124 is stably reduced by the heat treat at 1000° C.-1400° C. in ammonia atmosphere.

In this way, the SiC substrate 102 having the porous layer 124 shown in FIG. 4 is made. After this, the group III nitride semiconductor is epitaxially grown on the SiC substrate 102. In this embodiment, the n-type layer 106 consisting of n-GaN, the multiple quantum well active layer 108, the electron blocking layer 110, the p-type clad layer 112 and the p-type contact layer 114 are grown after the buffer layer 104 consisting of AlGaN is grown by, for example, a metalorganic chemical vapor deposition method. After the nitride semiconductor layer, the light emitting diode element 100 is made through forming each electrode 116, 118 and dividing to plural light emitting diode elements 100 by dicing. The SiC substrate 102 shown in FIG. 4 can be used as a fluorescent plate instead of a substrate of the light emitting diode element 100.

In the light emitting diode element 100 as described above, ultra violet light is radially emitted from the multiple quantum well active layer 108 when applying a voltage between the p-side electrode 116 and the n-side electrode 118. The ultra violet light from the multiple quantum well active layer 108 in a direction toward the p-side electrode 116 is mostly reflected at the p-side electrode 116 and travels toward the SiC substrate 102. Thus, most of the light emitted from the multiple quantum well active layer 108 travels in a direction toward the SiC substrate 102.

The incident ultra violet light of the SiC substrate 102 is converted to a first visible light which is from blue color to green color in the porous layer 124 and the remnant is converted to a second visible light which is from yellow color to orange color. These light radiate to the outside from the SiC substrate 102 and white light which has a high color rendering property and close to sun light is obtained. For example, in case that the porous layer 124 emits the first visible light having peak wavelength of 450 nm and the bulk layer 122 emits the second visible light having peak wavelength of 580 nm, the light emitting diode element 100 which covers almost all of the visual light range and emits pure white light is achieved.

According to the light emitting diode element 100, emission at shorter wavelength side of emission wavelength range of the bulk state 6H-type SiC doped with B and N is obtained at the porous layer 124 without 6H-type SiC doped with Al. Thus, because doping elements in the SiC substrate 102 are only B and N, it is easy to make the SiC substrate 102 and cost of making the SiC substrate 102, eventually cost of manufacturing the light emitting diode element 100 is reduced.

According to this embodiment, when manufacturing the SiC substrate 102 having the bulk layer 122 and porous layer 124, it is not necessary to add a special twist to manufacturing equipment, raw materials etc. and it has great advantages from a practical viewpoint. Especially, it is not necessary to epitaxial grow the SiC substrate 102 and the SiC substrate 102 is made at relatively high speed.

According to this embodiment, after the SiC substrate 102 formed the porous layer 124 is heat treated in hydrogen atmosphere, it is treated in ammonia atmosphere and the protection film is formed on the surface of the porous layer 124, thus, surface level density is greatly reduced. Thus, it is prevented that the recombination possibility of the donor-acceptor-pair and the emission strength are reduced caused by increasing the rate of nonradiative recombination by surface recombination. In the porous layer 124, because the rate of nonradiative recombination by surface recombination is higher, the smaller by changing to porous state the average size of crystal is, the larger the effect by the protection film is. This embodiment that the protection film is formed on the porous layer 124 resolves new issue caused by changing SiC to porous state in the donor-acceptor-pair emission field.

Figure 6:
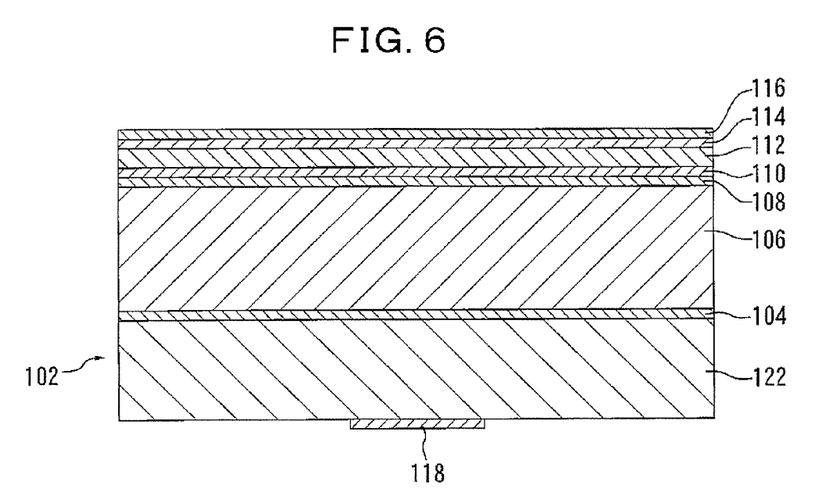
FIG. 6 is a typical cross-sectional drawing of a bulk state SiC substrate having an electrode formed on a semiconductor layer in other embodiment.
Figure 7:
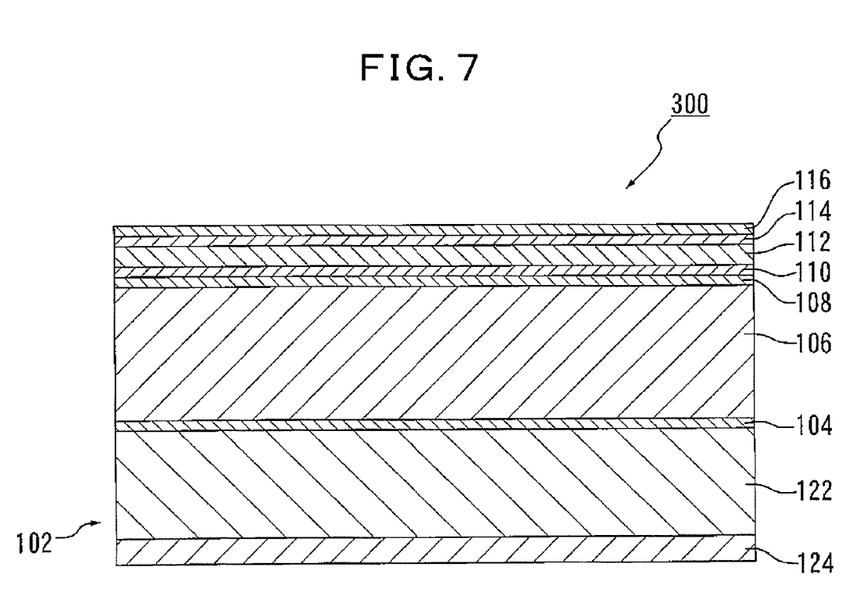
FIG. 7 is a typical cross-sectional drawing of a light emitting diode element of other embodiment.

In the above embodiment, although it shows that the semiconductor layer is stacked on the SiC substrate 102 after the porous layer 124 of the SiC substrate 102 is formed, it is possible that the porous layer 124 of the SiC substrate 102 is formed after the semiconductor layer is stacked on the SiC substrate 102. For example, as shown in FIG. 6, the p-side electrode 116 is formed after the SiC substrate 102 consisting of the bulk layer 122 is made and the group III nitride semiconductor is epitaxially grown on the SiC substrate 102. As shown in FIG. 7, it is possible to form the porous layer 124 on the SiC substrate 102 by using the p-side electrode 116 in the anodic oxidation of the SiC substrate 102 instead of the ohmic electrode 201 in the above embodiment. The light emitting diode element 300 shown in FIG. 7 has the porous layer 124 at the opposite side of the growth face of the semiconductor layer of the SiC substrate 102. Furthermore, it is possible to carry out the anodic oxidation by attaching a conductor substrate without the ohmic electrode 201 on the SiC substrate 102. And it is possible for the light emitting diode element to form the semiconductor layer on the conductor substrate.

Also, in the above embodiment, although it shows that the SiC substrate 102 of bulk state is obtained by the sublimation and recrystallization, it is possible that the SiC substrate 102 is obtained by a CVD method etc. Also, although it shows that changing SiC to porous state is carried out by the anodic oxidation, the method for changing to porous state is arbitrary and, for example, it is possible that it is carried out by vapor-phase etching.

Also, in the above embodiment, although it shows that SiC changed to porous state is used as the substrate of the light emitting diode element 100, it is possible that it is used as a phosphor separated from a light source. The porous state single-crystal 6H-type SiC doped with B and N can be used as a powder and it can also be used as a fluorescent plate for converting wavelength. Also, it is possible that SiC changed to porous state is used as a thing which emits not only visible light but also ultra violet light.

Also, in the above embodiment, although it shows the light emitting diode element 100 which emits white light by using the SiC substrate 102 having the bulk layer 122 and the porous layer 124, for example, a light emitting diode element which emits green light by using the SiC substrate 102 having only the porous layer 124. Also, in the above embodiment, although it shows that the porous layer 124 is formed on all the area of the surface side of the bulk layer 122, it is possible that the porous layer 124 is formed on a part of the surface side of the bulk layer 122. Also, in the above embodiment, although it shows that the porous layer 124 is made by changing a part of the bulk layer 122 to porous state, it is possible that the SiC having the bulk layer 122 and the SiC having the porous layer 124 are separately made.

Also, in the above embodiment, although it shows that the protection film of the porous layer 124 is made by nitride, it is possible that it is made by other materials such as oxinitride. Of course, concrete conditions in heat treat step, forming protection film step etc. can also be changed accordingly.

Practical examples of porous state single-crystal 6H-type SiC doped with B and N are explained in reference to FIG. 8, FIG. 9, FIG. 10, FIG. 11, FIG. 12, FIG. 13 and FIG. 14.

Single-crystal 6H-type SiC doped with B and N was made by the sublimation method and plenty of samples changed to porous state was made by the anodic oxidation. Concerning concentration of B and N in SiC, the concentration of B was $3\times10^{18}/cm^3$ and the concentration of N was $5\times10^{18}/cm^3$ such that stable emission was obtained. Data of emission wavelength and emission strength were obtained under anodic oxidation conditions that the mass concentration of hydrofluoric acid aqueous solution was 5% and the concentration of potassium persulfate was changed within 0-0.03 mol/l. The anodic oxidation was carried out under conditions that the current density was 2 mA/cm$^2$, the current-carrying time was 120 minutes and the thickness of obtained porous state SiC was 10 μm.

[Sample 1]

Figure 8:
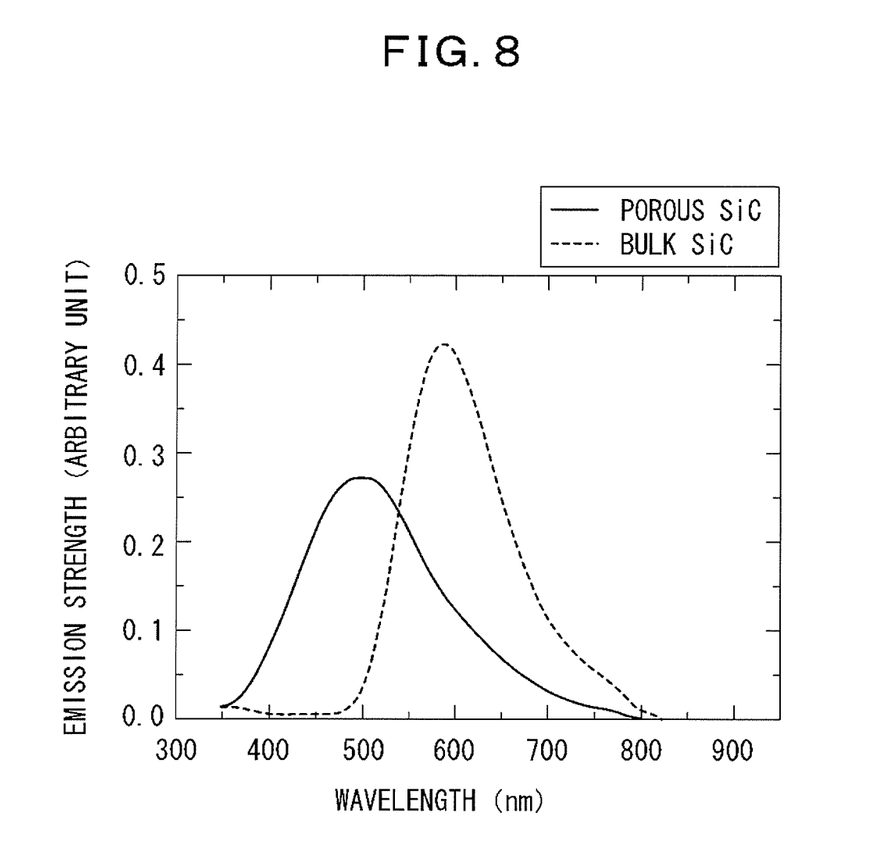
FIG. 8 is a graph showing an emission wavelength and emission strength of sample 1.

FIG. 8 is a graph showing an emission wavelength and emission strength of sample 1. The emission wavelength and emission strength were obtained at room temperature under the conditions using 325 nm and 8 mW (beam radius: 1 mm) of He—Cd laser as excitation light. The emission wavelength and emission strength prior to changing bulk SiC to porous state were shown in FIG. 8.

The sample 1 was made by not adding potassium persulfate to hydrofluoric acid aqueous solution (that is 0 mol/l). As shown in FIG. 8, the peak wavelength of the sample 1 was 491 nm and the emission shorter than 578 nm of the peak wavelength prior to changing to porous state was observed. The emission strength is decreased by changing to porous state.

[Sample 2]

Figure 9:
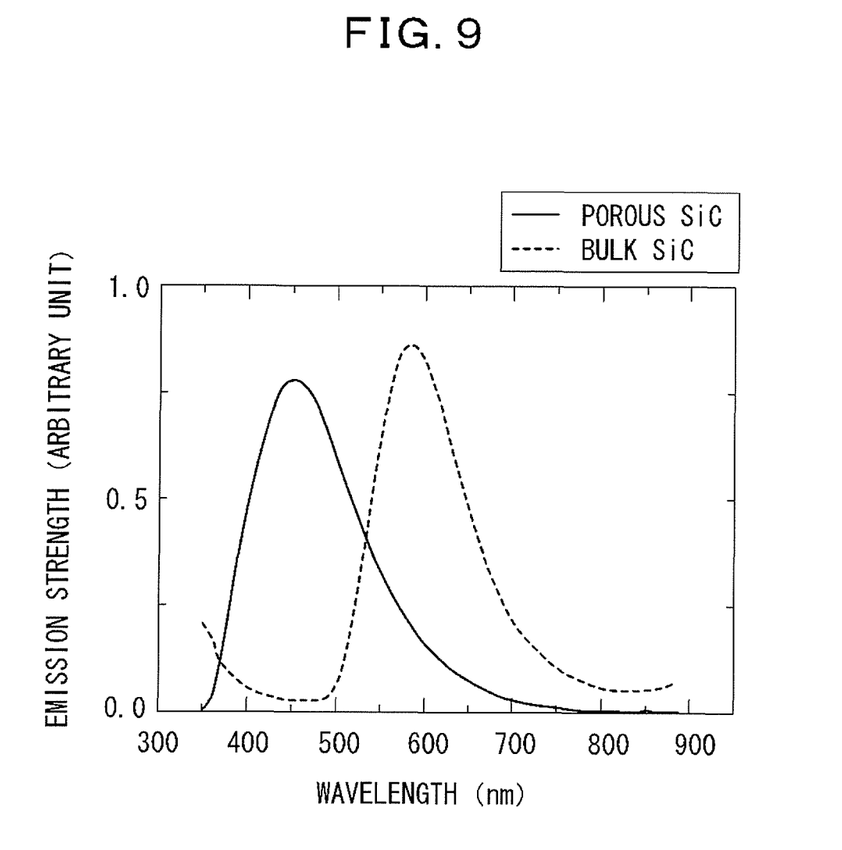
FIG. 9 is a graph showing an emission wavelength and emission strength of sample 2.

FIG. 9 is a graph showing an emission wavelength and emission strength of sample 2. The emission wavelength and emission strength were obtained at room temperature under the conditions using 325 nm and 8 mW (beam radius: 1 mm) of He—Cd laser as excitation light. The emission wavelength and emission strength prior to changing bulk SiC to porous state were shown in FIG. 9.

The sample 2 was made by adding potassium persulfate of 0.01 mol/l to hydrofluoric acid aqueous solution. As shown in FIG. 9, the peak wavelength of the sample 2 was 449 nm and the emission shorter than 580 nm of the peak wavelength prior to changing to porous state was observed. In the sample 2, also, the emission strength is slightly decreased by changing to porous state.

[Sample 3]

Figure 10:
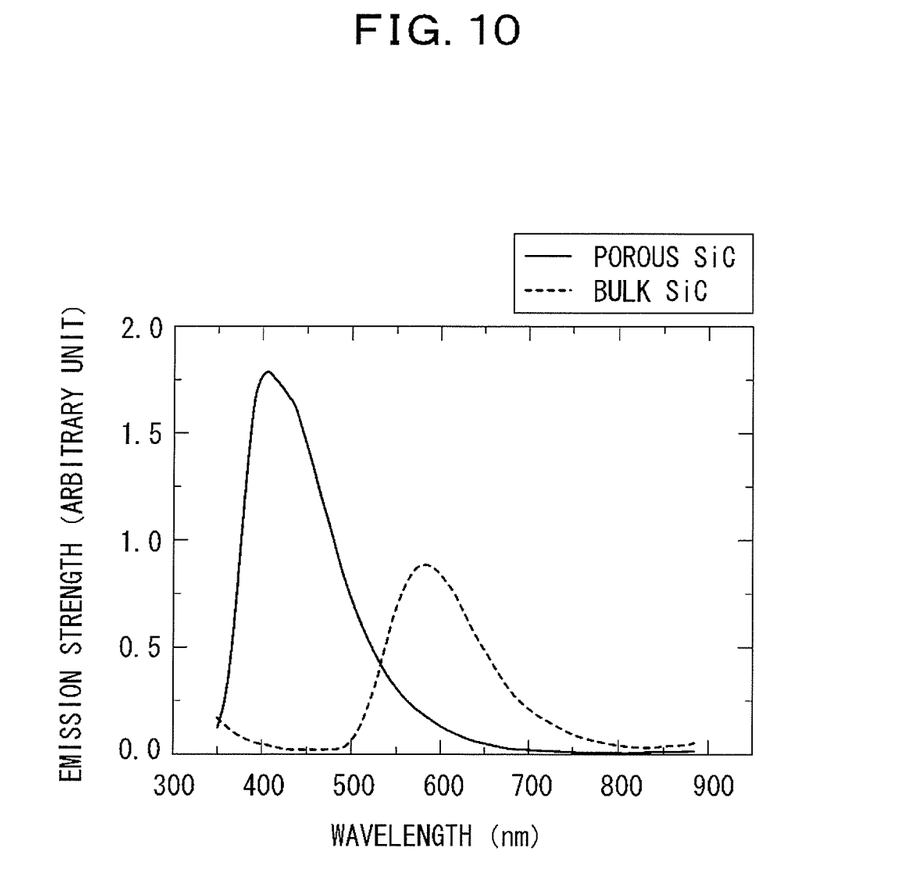
FIG. 10 is a graph showing an emission wavelength and emission strength of sample 3.

FIG. 10 is a graph showing an emission wavelength and emission strength of sample 3. The emission wavelength and emission strength were obtained at room temperature under the conditions using 325 nm and 8 mW (beam radius: 1 mm) of He—Cd laser as excitation light. The emission wavelength and emission strength prior to changing bulk SiC to porous state were shown in FIG. 10.

The sample 3 was made by adding potassium persulfate of 0.02 mol/l to hydrofluoric acid aqueous solution. As shown in FIG. 10, the peak wavelength of the sample 3 was 407 nm and the emission shorter than 583 nm of the peak wavelength prior to changing to porous state was observed. In the sample 3, the emission strength is increased by changing to porous state.

[Sample 4]

Figure 11:
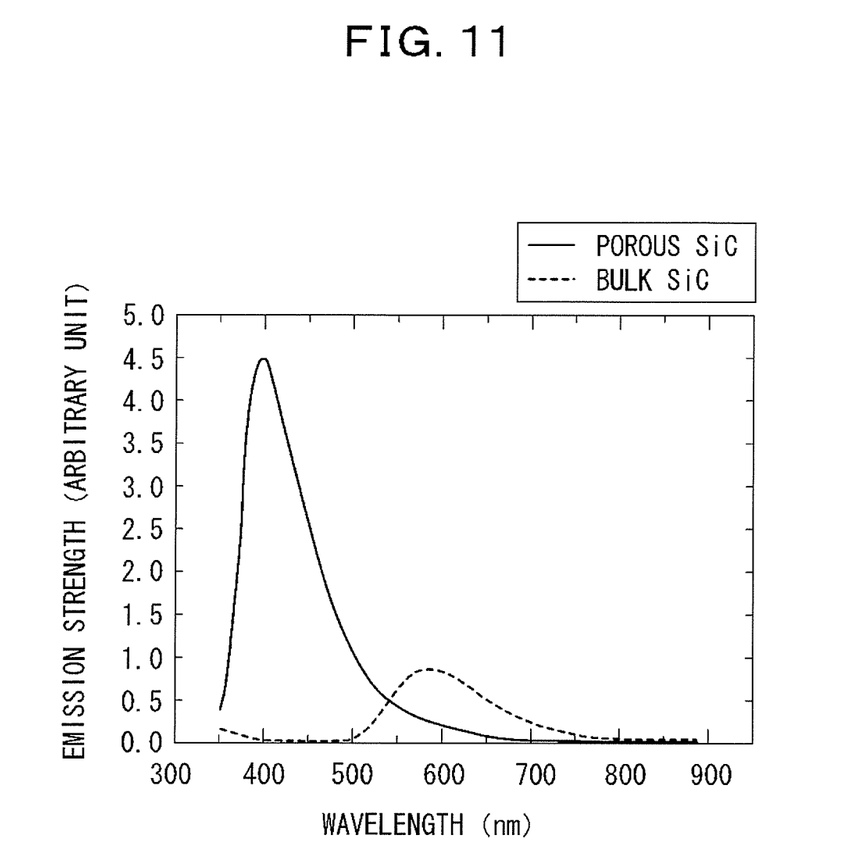
FIG. 11 is a graph showing an emission wavelength and emission strength of sample 4.

FIG. 11 is a graph showing an emission wavelength and emission strength of sample 4. The emission wavelength and emission strength were obtained at room temperature under the conditions using 325 nm and 8 mW (beam radius: 1 mm) of He—Cd laser as excitation light. The emission wavelength and emission strength prior to changing bulk SiC to porous state were shown in FIG. 11.

The sample 4 was made by adding potassium persulfate of 0.03 mol/l to hydrofluoric acid aqueous solution. As shown in FIG. 11, the peak wavelength of the sample 4 was 394 nm and the emission shorter than 582 nm of the peak wavelength prior to changing to porous state was observed. In the sample 4, the emission strength is greatly increased by changing to porous state.

Figure 12:
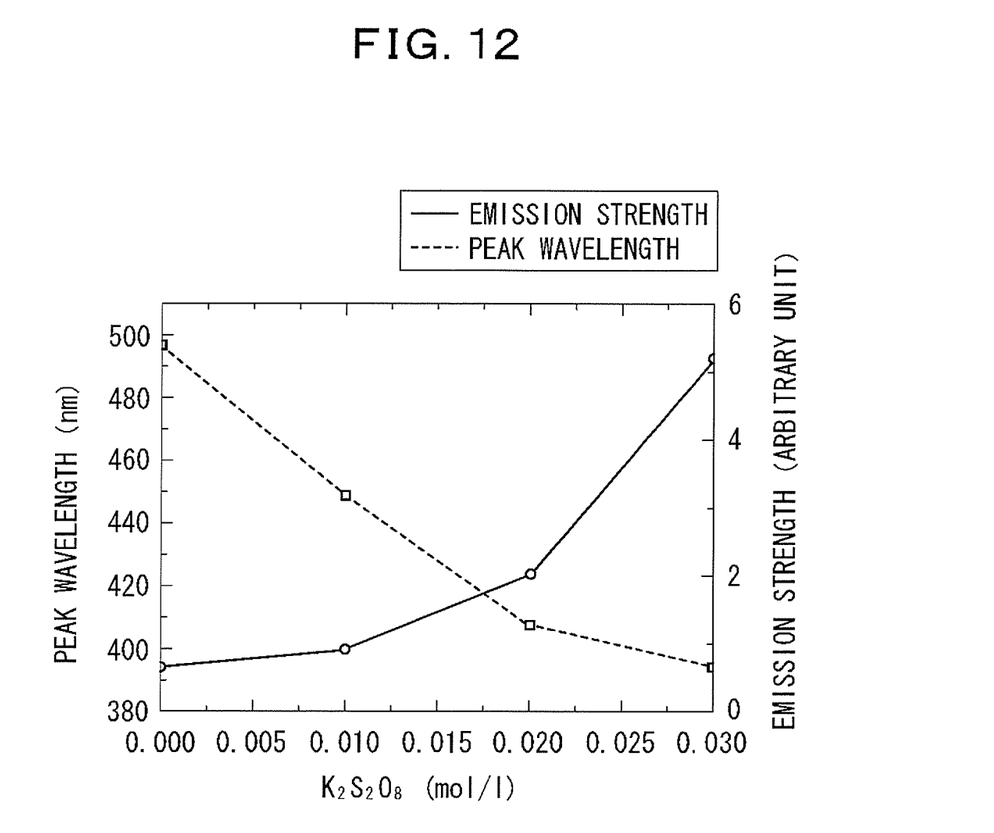
FIG. 12 is a graph showing a relationship between emission strength, peak wavelength and concentration of potassium persulfate.

FIG. 12 is a graph showing a relationship between emission strength, peak wavelength and concentration of potassium persulfate.

As shown in FIG. 12, it is understood that when the concentration of potassium persulfate is increased, the peak wavelength is shorter and the emission strength is higher.

Also, by observation with an electron microscope, it is confirmed that when the concentration of potassium persulfate is increased, the average size of SiC crystal changed to porous state is shorter. Thus, it is thought that shorter wavelength and higher emission strength with increasing the concentration of potassium persulfate are caused by a quantum size effect.

Figure 13:
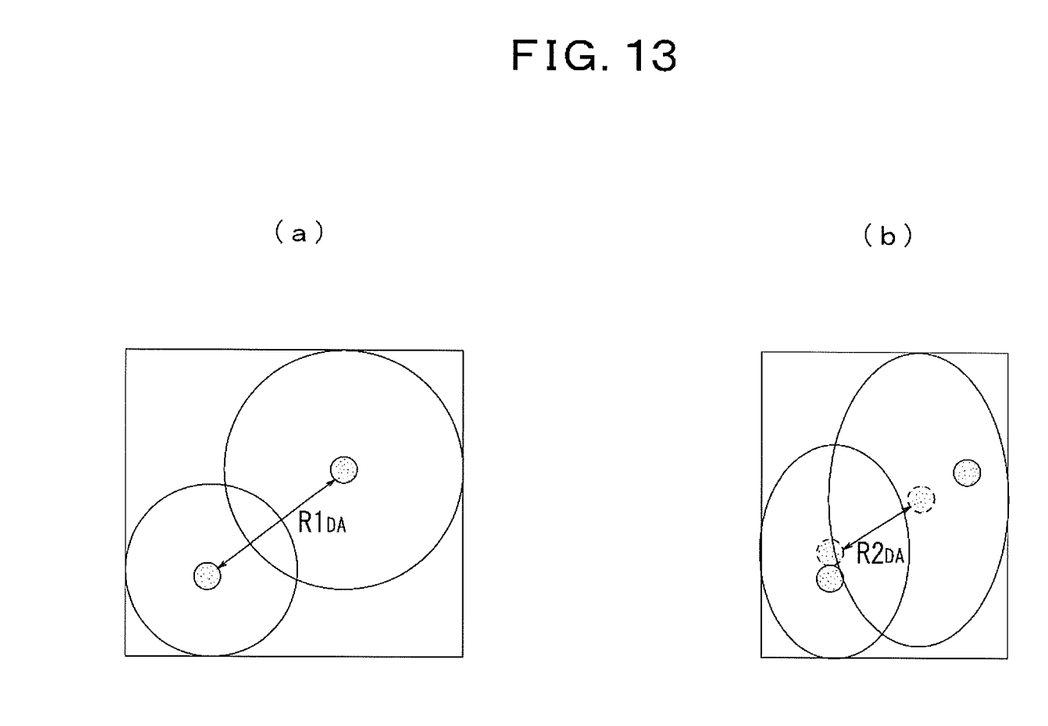
FIG. 13 is a drawing for explaining donor-acceptor-pair emission, and (a) shows state in bulk crystal and (b) shows state in porous crystal.

FIG. 13 is a drawing for explaining donor-acceptor-pair emission, and (a) shows state in bulk crystal and (b) shows state in porous crystal.

The transition energy $E_{DA}$ by recombination of donor-acceptor-pair is generally represented below.

$$E_{DA}=E_g-(E_D+E_A)+e^2/\epsilon R_{DA} \quad \text{[Mathematical formula 2]}$$

In the above formula, $E_g$ is the band gap energy of crystal, $E_D$ is the ionization energy of donor, $E_A$ is the ionization energy of acceptor, e is the electronic charge, $\epsilon$ is the permittivity and $R_{DA}$ is the average distance between donor and acceptor. When the crystal size is smaller, $E_g$ is larger as it is generally known. Also, although the actual distance between donor and acceptor is constant, because electrons trapped in donor and holes trapped in acceptor go around an orbit of the Bohr radius centering around the each impurity, its orbit are influenced in shrinking the crystal size as shown in FIG. 13(b).

In case of the bulk crystal, as shown in FIG. 13(a), electrons trapped in donor and holes trapped in acceptor go around the orbit of a sphere centering around the each impurity. And an orbital overlap of electrons and holes is proportional to the rate of recombination of donor-acceptor-pair.

On the other hand, as shown in FIG. 13(b), because crystal partially disappears and electrons trapped in donor and holes trapped in acceptor can not keep a sphere, they become the orbit of an elliptically sphere, which the impurity is mismatched to the centroid. As a result, the both orbital overlap is larger and the rate of recombination is increased. And $R_{DA}$ in the above formula is $R1_{D1}$ before changing to porous state, $R1_{DA}$ becomes $R2_{DA}$ substantially smaller than $R1_{DA}$ after changing to porous state. Thus, the transition energy becomes further larger with changing to porous state. It is thought that the experimental result of the samples 1-4 is caused by this theoretical background.

Meanwhile for emitting from blue color to green color from porous SiC, the concentration of potassium persulfate is relatively lower. When the concentration of potassium persulfate is lower, the emission efficiency is not relatively higher because the surface recombination is dominant. Therefore, for reducing the surface level which causes the surface recombination, the sample 5 was made by heat treating the sample 1.

[Sample 5]

Figure 14:
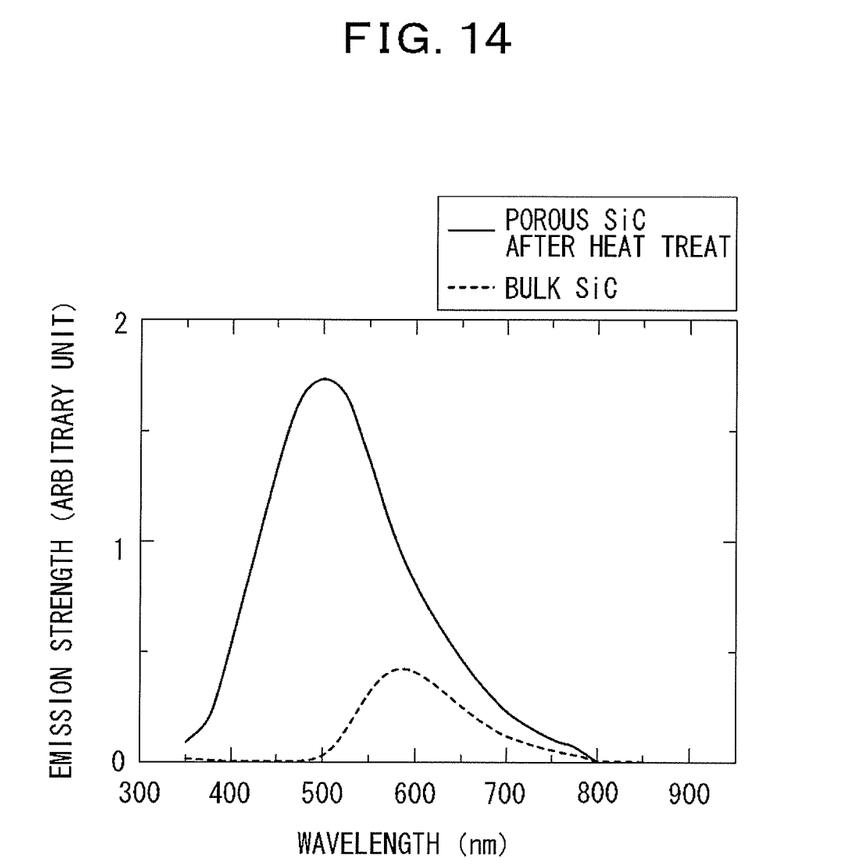
FIG. 14 is a graph showing an emission wavelength and emission strength of sample 5.

FIG. 14 is a graph showing an emission wavelength and emission strength of sample 5. The emission wavelength and emission strength were obtained at room temperature under the conditions using 325 nm and 8 mW (beam radius: 1 mm) of He—Cd laser as excitation light. The emission wavelength and emission strength prior to changing bulk SiC to porous state were shown in FIG. 14.

The sample 5 was made by forming the protection film of $Si_3N_4$ on the surface of the porous SiC through heat treat to the sample 1 at 1300° C. in ammonia atmosphere in 5 minutes after heat treat at 1300° C. in hydrogen atmosphere in 10 minutes. In this way, as shown in FIG. 14, the emission strength is greatly increased.

REFERENCE SIGNS LIST

100 Light emitting diode element
102 SiC substrate
104 Buffer layer
106 n-type layer
108 Multiple quantum well active layer
110 Electron blocking layer
112 p-type clad layer
114 p-type contact layer
116 p-side electrode
118 n-side electrode
200 Anodic oxidation apparatus
202 Stainless plate
204 Aperture
206 Vessel
208 Platinum wire
210 DC power source
212 Anti-hydrofluoric-acid sheet
214 Solution
216 Aperture
218 Ultra violet light
300 Light emitting diode element

The invention claimed is:

1. A light emitting diode element comprising;
a semiconductor light emitting part emitting light by recombination of electrons and holes; and a porous SiC part which is formed in cellular state and has an interface between itself and atmosphere in its interior, and consists of single crystal 6H-type SiC doped with N and B, and emits visible light caused by donor-acceptor-pair emission for dopants of N and B when excited by light from the semiconductor light emitting part;

a bulk SiC part which consists of a bulk state of single crystal 6H-type SiC doped with N and B, and emits visible light caused by donor-acceptor-pair emission for dopants of N and B at longer wavelengths than the porous SiC part when excited by light from the semiconductor light emitting part, wherein a doping concentration of B and N in the porous SiC part is between $10^{15}/cm^3$ and $10^{19}/cm^3$ and a doping concentration of B and N in the bulk SiC part is between $10^{15}/cm^3$ and $10^{19}/cm^3$;

wherein, when illuminated by light having a wavelength of 325 nm, the porous SiC part emits light of wavelengths between 350 nm and 800 nm and said light has an intensity peak within 400 nm-500 nm, and wherein, when illuminated by light having a wavelength of 325 nm, the bulk SiC part emits light of wavelengths between 500 nm and 800 nm and said light has an intensity peak at about 600 nm.

2. The light emitting diode element according to claim 1, wherein the porous SiC part is integrally formed over the bulk SiC part.

3. The light emitting diode element according to claim 2, wherein the semiconductor light emitting part is formed on the bulk SiC part which is partially changed to the porous state.

4. The light emitting diode element according to claim 1, further comprising a p-type contact layer in direct contact with a p-electrode.

5. The light emitting diode element according to claim 4, wherein the p-type contact layer comprises GaN.

6. A method for manufacturing the light emitting diode element according to claim 1 comprising the steps of;
   forming an ohmic electrode on the bulk state of single crystal 6H-type SiC doped with N and B; and
   forming the porous SiC part by carrying out anodic oxidation to the bulk state of single crystal 6H-type SiC.

7. The method for manufacturing the light emitting diode element according to claim 6, comprising the further steps of;
   forming a protection film on the porous SiC part which is heat treated.

8. The method for manufacturing the light emitting diode element according to claim 7, wherein a hydrofluoric acid aqueous solution including an oxidation agent is used as a solution reacting with the single crystal 6H-type SiC during the anodic oxidation.

9. The method for manufacturing the light emitting diode element according to claim 8, wherein the oxidation agent is potassium persulfate.

* * * * *